United States Patent

Sugiyama

(10) Patent No.: US 10,120,209 B2
(45) Date of Patent: Nov. 6, 2018

(54) OPTICAL TRANSMISSION DEVICE AND OPTICAL MODULE

(71) Applicant: Fujitsu Optical Components Limited, Kawasaki-shi, Kanagawa (JP)

(72) Inventor: Masaki Sugiyama, Kawasaki (JP)

(73) Assignee: FUJITSU OPTICAL COMPONENTS LIMITED, Kawasaki (JP)

(*) Notice: Subject to any disclaimer, the term of this patent is extended or adjusted under 35 U.S.C. 154(b) by 0 days.

(21) Appl. No.: 15/244,438

(22) Filed: Aug. 23, 2016

(65) Prior Publication Data

US 2017/0082875 A1 Mar. 23, 2017

(30) Foreign Application Priority Data

Sep. 18, 2015 (JP) ................................ 2015-185449

(51) Int. Cl.
 *G02F 1/01* (2006.01)
 *G02F 1/025* (2006.01)
(52) U.S. Cl.
 CPC ............ *G02F 1/0121* (2013.01); *G02F 1/025* (2013.01); *G02F 2201/12* (2013.01)
(58) Field of Classification Search
 CPC ................ G02B 6/00; G02B 6/44; G02F 1/01
 USPC ............................................................ 385/14
 See application file for complete search history.

(56) References Cited

U.S. PATENT DOCUMENTS

| 3,863,261 | A | * | 1/1975 | Klein | ........................ | B41J 2/415 347/123 |
| 6,181,718 | B1 | * | 1/2001 | Kobayashi | .......... | H01S 5/02284 372/34 |
| 6,577,370 | B1 | * | 6/2003 | Sato | ..................... | B41J 2/14274 349/149 |
| 7,593,650 | B2 | * | 9/2009 | Kagaya | ................... | H03F 3/087 398/202 |
| 8,428,399 | B2 | * | 4/2013 | Takabayashi | .......... | B82Y 20/00 385/2 |
| 9,553,671 | B1 | * | 1/2017 | Nagarajan | ............... | H04B 10/40 |
| 9,671,580 | B1 | * | 6/2017 | Nagarajan | ............. | G02B 6/4257 |
| 2002/0057235 | A1 | * | 5/2002 | Murai | .................. | G02F 1/13452 345/84 |

(Continued)

FOREIGN PATENT DOCUMENTS

| JP | 2001-230506 | 8/2001 |
| JP | 2012-47823 | 3/2012 |

(Continued)

*Primary Examiner* — Kaveh C Kianni
(74) *Attorney, Agent, or Firm* — Staas & Halsey LLP

(57) ABSTRACT

An optical transmission device includes: an optical modulation package that includes a plurality of terminals that are exposed to an outside from a front surface thereof, and performs optical modulation on electrical signals input from the terminals; a flexible board that includes: an electrode arrangement part on which electrodes respectively connected to the terminals are arranged side by side to transmit the electrical signals to the terminals; and an arm part that projects more outward than an electrode located on an end of the electrode arrangement part and extends toward the optical modulation package to be locked to the optical modulation package; and an optical transmission member that transmits an optical signal obtained by the optical modulation performed by the optical modulation package.

7 Claims, 12 Drawing Sheets

(56) References Cited

U.S. PATENT DOCUMENTS

| | | | | |
|---|---|---|---|---|
| 2003/0147575 A1* | 8/2003 | Sugiyama | ............ | G02F 1/0305 385/2 |
| 2004/0264835 A1* | 12/2004 | Matsushima | ........ | G02B 6/4201 385/14 |
| 2005/0121684 A1* | 6/2005 | Aruga | ................. | G02B 6/4204 257/99 |
| 2005/0213863 A1* | 9/2005 | Sugiyama | ............ | G02F 1/2255 385/2 |
| 2005/0213882 A1* | 9/2005 | Go | ....................... | G02B 6/4201 385/37 |
| 2006/0029319 A1* | 2/2006 | Sugiyama | ............ | G02F 1/2255 385/1 |
| 2007/0053628 A1* | 3/2007 | Park | ..................... | G02F 1/0121 385/14 |
| 2012/0051683 A1* | 3/2012 | Sugiyama | ............... | G02F 1/035 385/1 |
| 2013/0108210 A1* | 5/2013 | Uemura | ............... | G02B 6/1221 385/14 |
| 2013/0301013 A1* | 11/2013 | Samejima | .......... | G03B 21/2033 353/52 |
| 2014/0119686 A1* | 5/2014 | Sugiyama | ............ | G02F 1/2255 385/2 |
| 2014/0119745 A1* | 5/2014 | Sugiyama | ............ | G02F 1/2255 398/188 |
| 2014/0126917 A1 | 5/2014 | Sato | | |
| 2017/0090132 A1* | 3/2017 | Nagarajan | ............ | G02B 6/4246 |

FOREIGN PATENT DOCUMENTS

| | | |
|---|---|---|
| JP | 2013-153136 | 8/2013 |
| JP | 2014-89400 | 5/2014 |

\* cited by examiner

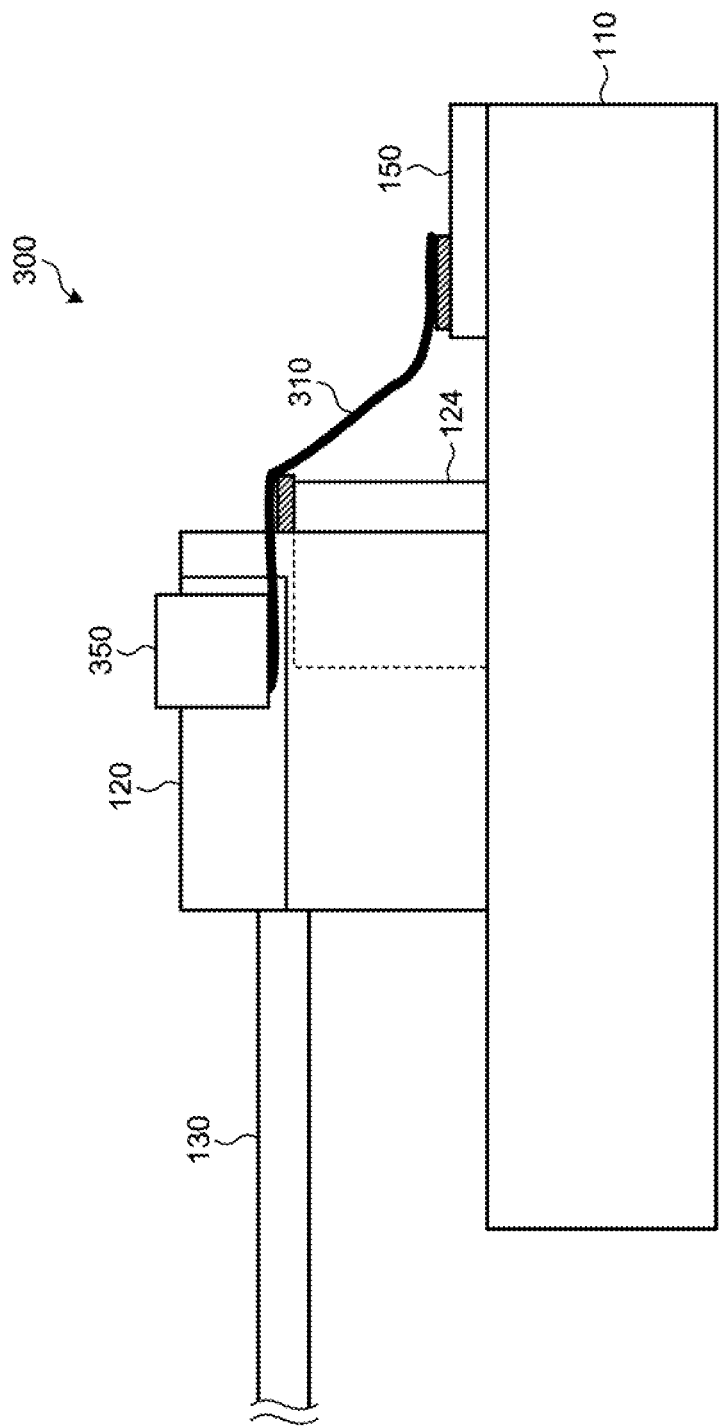

OPTICAL TRANSMISSION DEVICE AND OPTICAL MODULE

CROSS-REFERENCE TO RELATED APPLICATION

This application is based upon and claims the benefit of priority of the prior Japanese Patent Application No. 2015-185449, filed on Sep. 18, 2015, the entire contents of which are incorporated herein by reference.

FIELD

The embodiments discussed herein are related to an optical transmission device and an optical module.

BACKGROUND

In recent years, a package into which an optical source such as a laser diode and an optical modulator for modulating light from the optical source are integrated may be mounted on an optical module that sends and receives optical signals. The package is arranged on a board such as a Printed Circuit Board (PCB), and converts electrical signals, which are input from a driver connected via electrodes on the board, into optical signals.

The connection between the package and the electrodes on the board is realized by soldering, for example, leads projecting from a bottom face of the package to the electrodes on the board. The package and the board may be connected via a flexible board (FPC: Flexible Printed Circuit) with appropriate electrode pattern design in order to restrain impedance mismatches at connecting parts. In other words, for example, electrodes on the FPC board are soldered to leads that project from side surfaces of the package, and further the electrodes on the FPC board and the electrodes on the board are soldered to each other.

Lithium niobate (LiNbO$_3$ (LN)) is used as material of an optical modulator included in the package in many cases, however, indium phosphide (InP), a silicon photonic integrated circuit (Si—PIC), or the like is introduced to miniaturize the optical modulator in these days. By using these materials, the optical modulator is miniaturized, and thus the package can be miniaturized.

In order to miniaturize the package, it is desirable that the size of an electrical interface that connects the package to the board or the FPC board is reduced. On this point, as described above, when the leads that project from the bottom face of the package are used as the electrical interface, restriction on design occurs, for example, a gap is provided between pads for brazing the leads to the package, and therefore, there is limitation in reducing pitches between the leads. Also, when the FPC board is used, restriction on design occurs, for example, lands are arranged around through-holes into which the leads that project from side surfaces of the package are inserted, and therefore, there is limitation in reducing pitches between the leads.

Therefore, a configuration is studied in which, instead of using the leads, a ceramic board is exposed to the outside of the package and terminals on the ceramic board are used as the electrical interface. In such a configuration, the terminals on the ceramic board can be directly soldered to, for example, the electrodes on the FPC board, and thus pitches between the terminals can be adjusted to decrease comparatively easily. As a result, it is possible to miniaturize the package and to provide the miniaturized optical module.

Patent document 1: Japanese Laid-open Patent Publication No. 2001-230506
Patent document 2: Japanese Laid-open Patent Publication No. 2012-47823
Patent document 3: Japanese Laid-open Patent Publication No. 2014-89400
Patent document 4: Japanese Laid-open Patent Publication No. 2013-153136

However, there is a problem that work efficiency in manufacturing is not sufficient when the terminals on the ceramic board and the electrodes on the FPC board are soldered to each other. Specifically, because a part that is exposed from the package of the ceramic board is small, it is difficult to fix the FPC board to the part and solder the terminals and the electrodes to each other. To solve this, to enlarge the exposed part by making the ceramic board project largely from the package may be considered, however in this case, the terminals on the ceramic board are elongated. As a result, high-frequency propagation loss increases, thereby leading to degradation of frequency bands of the transmitted electrical signals. In addition, the elongation of the terminals leads to enlargement of area of soldered regions, and thus the possibility of occurrence of impedance mismatches increases. Therefore, it is desirable that the efficiency of soldering to the FPC board is improved without enlarging the exposed part of the ceramic board.

Moreover, in such a case that the package is miniaturized, the pitches between the terminals on the ceramic board decrease, however, the decrease in the pitches between the terminals leads to difficulty in positional adjustment between the terminals and the electrodes on the FPC board. Specifically, in such a case that the terminals on the ceramic board and the electrodes on the FPC board are directly soldered, there is no means for fixing the position of the FPC board, for example, a means for inserting the leads projecting from the package into through-holes of the FPC board. For this reason, also on this point, soldering of the terminals on the ceramic board and the electrodes on the FPC board is accompanied by a decrease in the work efficiency.

SUMMARY

According to an aspect of an embodiment, an optical transmission device includes: an optical modulation package that includes a plurality of terminals that are exposed to an outside from a front surface thereof, and performs optical modulation on electrical signals input from the terminals; a flexible board that includes: an electrode arrangement part on which electrodes respectively connected to the terminals are arranged side by side to transmit the electrical signals to the terminals; and an arm part that projects more outward than an electrode located on an end of the electrode arrangement part and extends toward the optical modulation package to be locked to the optical modulation package; and an optical transmission member that transmits an optical signal obtained by the optical modulation performed by the optical modulation package.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 10 is a diagram illustrating a specific example of a method for fixing the FPC board;

DESCRIPTION OF EMBODIMENTS

Preferred embodiments of the present invention will be explained with reference to accompanying drawings. The present invention is not limited to the embodiments described below.

[a] First Embodiment

Figure 1:
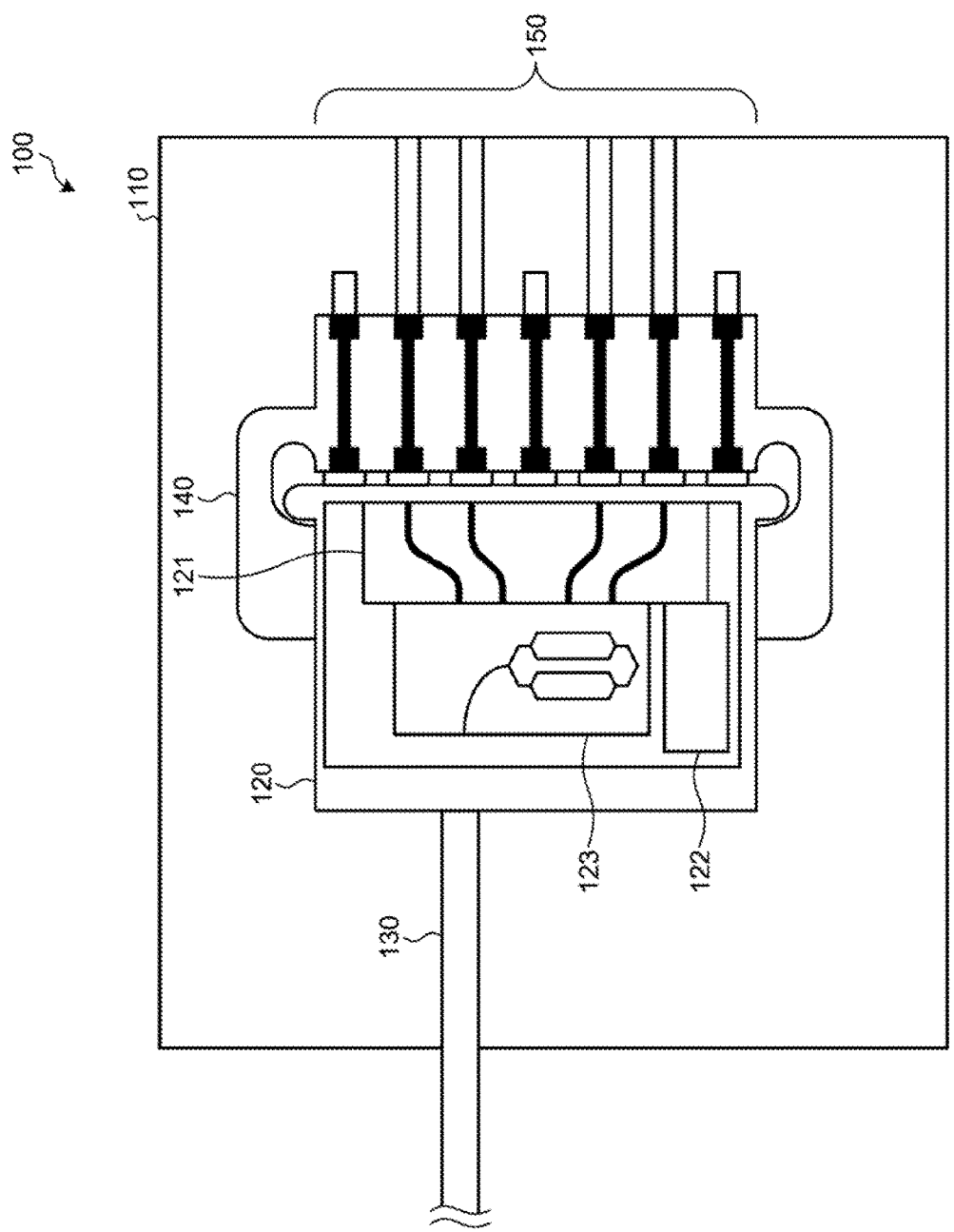
FIG. 1 is a schematic plan view illustrating a configuration of an optical module according to a first embodiment.
Figure 2:
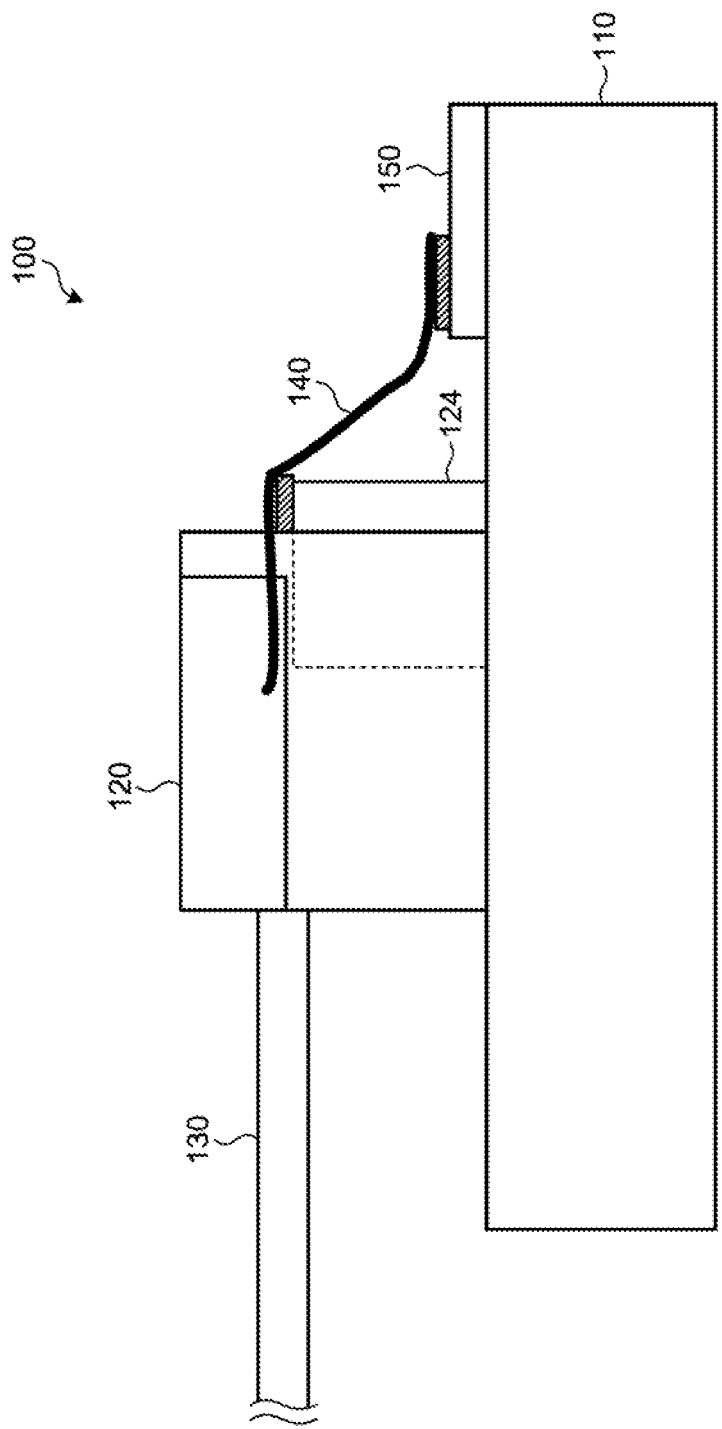
FIG. 2 is a schematic side view illustrating the configuration of the optical module according to the first embodiment.

FIG. 1 is a schematic plan view illustrating a configuration of an optical module 100 according to a first embodiment. FIG. 2 is a schematic side view illustrating the configuration of the optical module 100 according to the first embodiment. The optical module 100 illustrated in FIGS. 1 and 2 includes a PCB 110, a package 120, an optical fiber 130, a flexible printed circuit board (hereinafter, referred to as FPC) 140, and electrodes 150. The optical module 100 converts electrical signals that are output from a driver (not illustrated) into optical signals. In other words, differential signals of I and Q channels that are output from the driver are input to the package 120 through the electrodes 150 and the FPC 140, and the optical signals that are obtained by optical modulation of the package 120 are output to the optical fiber 130.

The PCB 110 is, for example, a glass epoxy board, and is a part that corresponds to a board on which various parts constituting the optical module 100 are mounted. The electrodes for electrically connecting various parts can be printed on the surface of the PCB 110.

The package 120 is a package in which parts for interconverting between the electrical signals and the optical signals are integrated. Specifically, the package 120 includes a relay board 121, a Laser Diode (LD) 122, an optical modulation chip 123, and a ceramic board 124.

The relay board 121 includes four signal electrodes that are connected to signal electrodes of the ceramic board 124 that are exposed to the outside, and by the signal electrodes, relays to the optical modulation chip 123 the electrical signals that is input to the package 120. The number of the signal electrodes of the relay board 121 is here four, because the differential signals of the I and Q channels are input to the package 120, however, the number of the signal electrodes of the relay board 121 is not limited thereto.

The LD 122 is an optical source that generates light used for an optical modulation and generates light of a predetermined wavelength and predetermined amplitude to supply the light to the optical modulation chip 123.

The optical modulation chip 123 is constituted of parallel optical waveguides, signal electrodes, and ground electrodes, and performs optical modulation on the basis of the electrical signals supplied from the signal electrodes while propagating the light from the LD 122 through the optical waveguides. Specifically, the optical modulation chip 123 superimposes the differential signals of one pair of the I and Q channels on the light that is propagated through the optical waveguides and obtains the optical signals. The optical modulation chip 123 outputs the optical signals obtained by the optical modulation to the optical fiber 130.

The ceramic board 124 is connected to the relay board 121 inside of the package 120, and a part of the ceramic board 124 is exposed to the outside of the package 120. On an upper surface of the part of the ceramic board 124 that is exposed to the outside of the package 120, a plurality of terminals are arranged that are connected to the electrodes of the FPC 140. These terminals are parts of the electrodes of the ceramic board 124, and the electrodes of the ceramic board 124 are connected to the electrodes of the relay board 121 inside of the package 120 by, for example, wire bonding. The relay board 121 and the ceramic board 124 need not necessarily be constituted separately, and they may be integrated with each other. In other words, the ceramic board 124 may connect the FPC 140 and the optical modulation chip 123 to relay the signals, for example.

The optical fiber 130 transmits the optical signals that are output from the optical modulation chip 123 to, for example, other optical transmission device or the like.

The FPC 140 is a flexible board having flexibility, and supplies to the package 120 the electrical signals that are output from the driver (not illustrated). In other words, the FPC 140 includes a plurality of signal electrodes and a plurality of ground electrodes, and transmits the electrical signals to the package 120 by using the signal electrodes. Herein, because the differential signals of the I and Q channels are transmitted to the package 120, the FPC 140 includes three ground electrodes at both ends and the center in its width direction and further includes four signal electrodes. Among the four signal electrodes, two electrodes are located between the one-end and center ground electrodes, and other two electrodes are located between the other-end and center ground electrodes. The signal electrodes and the ground electrodes are respectively soldered to the electrodes 150 at one end, and are respectively soldered to the terminals of the ceramic board 124 of the package 120 at the other end.

Also, the FPC 140 includes arm parts that project to the outer sides in the width direction of the FPC 140 from an electrode arrangement part in which the aforementioned signal electrodes and ground electrodes are arranged and extend toward the package 120. In other words, the arm parts project more outward than the ground electrodes that are located on both ends of the FPC 140 in the width direction and extend closer to the package 120 than a position in which each of the electrodes is soldered to the terminal of the ceramic board 124. The FPC 140 is temporarily positioned and temporarily fixed relative to the package 120 by putting both side surfaces of the package 120 between the arm parts, and thus work efficiency of soldering is improved. The details of the shape of the FPC 140 will be described later.

The electrodes 150 are conductor patterns printed on the PCB 110 and transmit to the FPC 140 the electrical signals that are output from the driver (not illustrated). Each of the electrodes 150 is soldered to the electrode arranged on the FPC 140. The ground electrodes 150 having ground voltage are here soldered to the ground electrodes that are arranged at both ends and the center in the width direction of the FPC 140. The signal electrodes between the ground electrodes of the FPC 140 are here soldered to the signal electrodes 150 that transmit the electrical signals.

Figure 3:
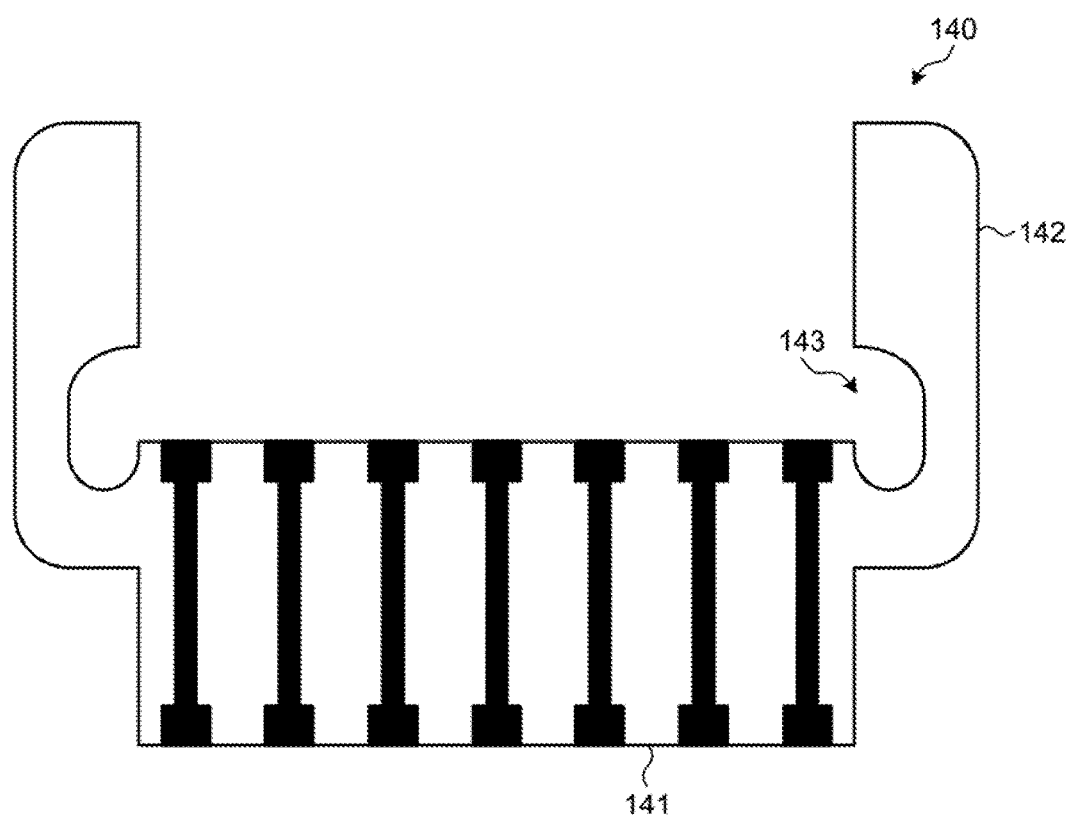
FIG. 3 is a diagram illustrating a configuration of a FPC board according to the first embodiment.

Next, the configuration of the FPC 140 will be explained with reference to FIG. 3. FIG. 3 is a diagram illustrating a configuration of the FPC 140 according to the first embodiment.

As illustrated in FIG. 3, the FPC 140 includes an electrode arrangement part 141 and arm parts 142. In the vicinity of a boundary between the electrode arrangement part 141 and the arm parts 142, concave parts 143 are formed. In the electrode arrangement part 141, electrodes are arranged side by side along the width direction of the FPC 140. As described above, the electrodes at both ends and the center in the width direction are the ground electrodes, and two signal electrodes are located between the one-end and center ground electrodes and further two signal electrodes are located between the other-end and center ground electrodes. In other words, the first, the fourth, and the seventh electrodes from the left of FIG. 3 are the ground electrodes, and the second, the third, the fifth, and the sixth electrodes from the left of FIG. 3 are the signal electrodes. For example, the first to the fourth electrodes from the left of FIG. 3 correspond to the signals of the I channel, and the fourth to the seventh electrodes from the left of FIG. 3 correspond to the signals of the Q channel. Therefore, the center electrode functions as the ground electrode of both the I and Q channels. An upper end of each electrode of FIG. 3 is soldered to the terminal of the ceramic board 124. On the contrary, a lower end of each electrode of FIG. 3 is soldered to the electrode 150 on the PCB 110.

The arm parts 142 project toward the outside at both ends of the electrode arrangement part 141 in the width direction and extend closer to the package 120 than the end part of the electrode arrangement part 141 that is connected to the ceramic board 124. In other words, an interval between a pair of the arm parts 142 is approximately equal to the width of the package 120. For this reason, temporary positioning with respect to the width direction of the FPC 140 can be done by putting the package 120 between a pair of the arm parts 142. Also, because the arm parts 142 extend toward the package 120, the center of gravity of the FPC 140 approaches the package 120. As a result, to keep the end part of the electrode arrangement part 141 contacted with the upper surface of the exposed part of the ceramic board 124 is easy, and thus work efficiency of soldering can be improved.

The concave parts 143 are formed at opposite positions that are located in the vicinity of the bases of a pair of arm parts 142. The concave parts 143 are locked to projecting parts that are shaped on side surfaces of the package 120, and thus temporary positioning in the longitudinal direction of the FPC 140 can be done.

Figure 4:
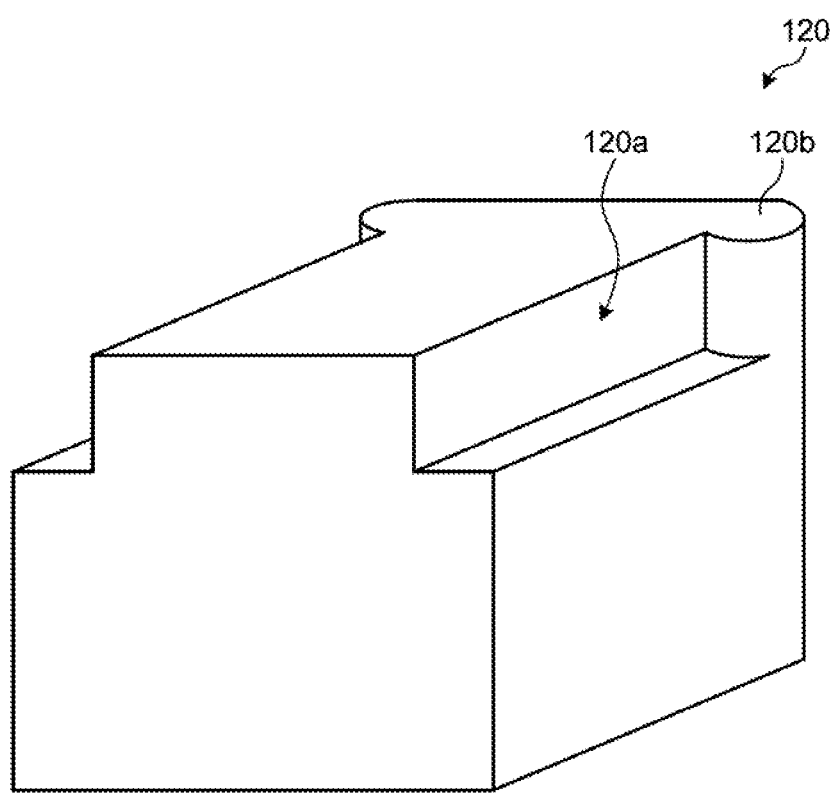
FIG. 4 is a perspective view illustrating a shape of a package according to the first embodiment.

The shape of the package 120 will be here explained with reference to FIG. 4. FIG. 4 is a perspective view illustrating the shape of the package 120 according to the first embodiment. As illustrated in FIG. 4, the package 120 includes cutout parts 120a up both side surfaces thereof and projecting parts 120b in a front part that is connected to the FPC 140. In other words, the package 120 has the shape that includes the cutout parts 120a shaped by cutting out upper parts of both side surfaces of the package 120 while leaving the projecting parts 120b in the front part of the package 120, which connects to the FPC 140.

As the package 120 has such a shape that is illustrated in FIG. 4, the concave parts 143 shaped in the arm parts 142 of the FPC 140 can be locked to the projecting parts 120b, and the state can be further easily kept, in which the end part of the electrode arrangement part 141 is in contact with the upper surface of the exposed part of the ceramic board 124. Moreover, the temporary positioning in the longitudinal direction of the FPC 140 can be done. As a result, the work efficiency of soldering between each of the electrodes that are arranged on the electrode arrangement part 141 and the terminal of the ceramic board 124 can be improved.

As described above, according to the present embodiment, the temporary positioning and the temporarily fixing of the FPC is realized by providing the arm parts that are projecting to the outer sides of the width direction of the electrode arrangement part of the FPC and also extending toward the package, and putting the package between the arm parts of the FPC. Therefore, the state can be easily kept, in which the end part of the electrode arrangement part of the FPC is in contact with the upper surface of the ceramic board that is exposed to the outside from the package, and thus the work efficiency of soldering between the terminals on the upper surface of the ceramic board and the terminals of the FPC can be improved.

In the aforementioned first embodiment, the differential signals of one pair of the I and Q channels are explained to be optically modulated by the optical modulation chip 123, however, single-ended signals instead of the differential signals may be optically modulated. In this case, the number of the signal electrodes corresponding to each of the I channel and the Q channel is one. In other words, the electrode arrangement part 141 of the FPC 140, for example, includes the ground electrodes at both ends and the center in the width direction, and one signal electrode is provided between the one-end and center ground electrodes, and further one signal electrode is located between the other-end and center ground electrodes.

Figure 5:
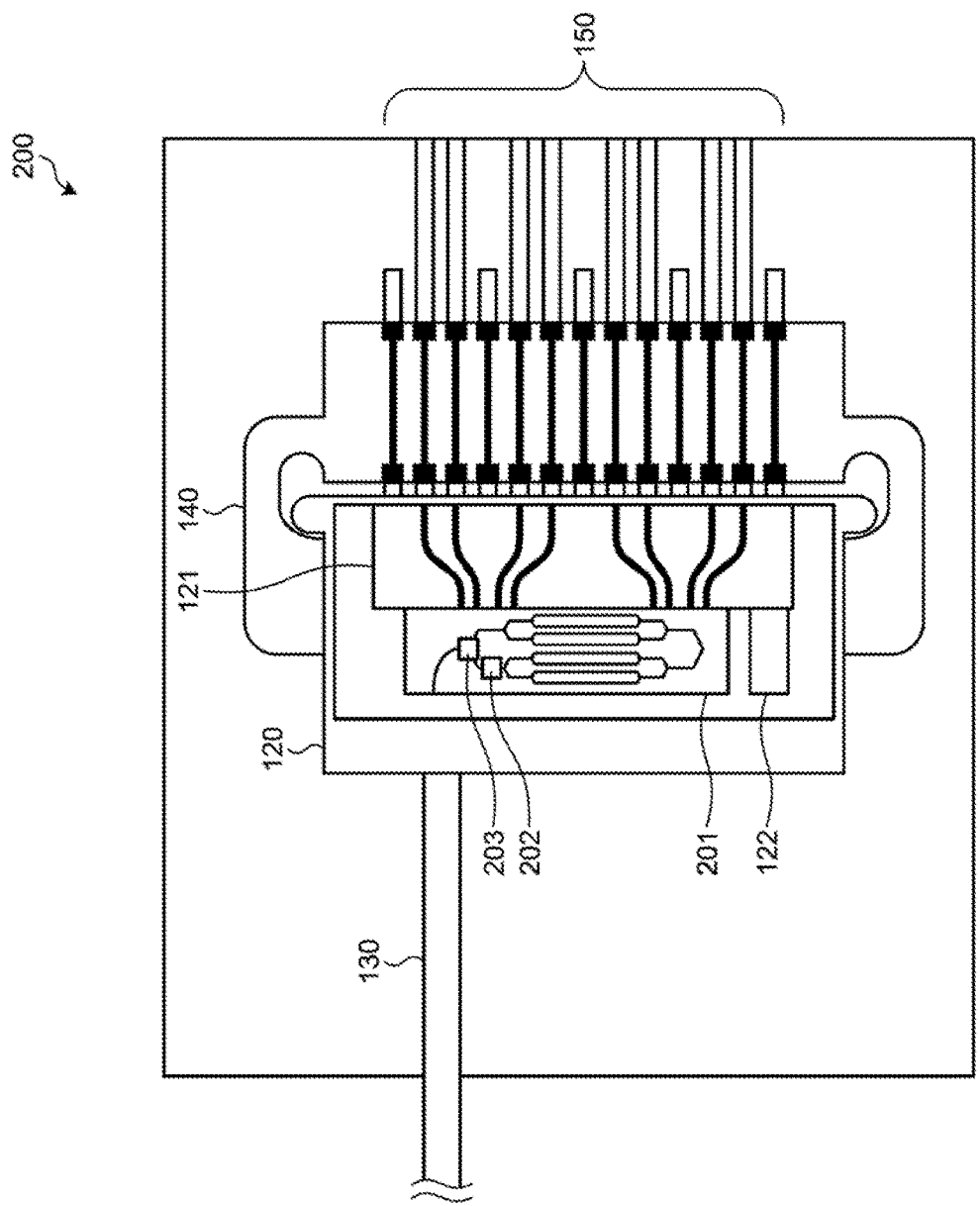
FIG. 5 is a schematic plan view illustrating another configuration of other optical module according to the first embodiment.

Moreover, the optical modulation chip may be another optical modulation chip that performs, for example, polarization multiplexing. FIG. 5 is a schematic plan view illustrating a configuration of an optical module 200 that includes the other optical modulation chip. In the following description with respect to FIG. 5, elements identical with those having already been explained in FIG. 1 are denoted by identical reference symbols, and duplicate description will be omitted. The optical module 200 illustrated in FIG. 5 employs a configuration in which the optical modulation chip 123 of the optical module 100 illustrated in FIG. 1 is replaced with an optical modulation chip 201.

The optical modulation chip 201 superimposes the differential signals of two pairs of the I and Q channels on the respective different polarized wave surfaces of light to obtain the optical signals. Specifically, the optical modulation chip 201 superimposes the differential signals of each of the two pairs of the I and Q channels on the polarized wave surface of light that is propagated through the optical waveguide, and rotates one of the polarized wave surfaces of the light in a polarized wave rotating part 202. Therefore, two different polarized waves are obtained on which the respective pairs of the differential signals are superimposed. The optical signals in which signals are superimposed on the respective different polarized wave surfaces are obtained by combining the two polarized waves in a polarized wave coupling part 203.

When the optical modulation chip 201 performs the optical modulation by using the polarization multiplexing in such a manner, the number of the signals that are input from the FPC 140 to the package 120 increases, and thus the numbers of the electrodes of the FPC 140 and the terminals on the ceramic board are also increases. Also in such a case, the work efficiency of soldering between the electrodes of the FPC 140 and the terminals on the ceramic board can be improved by shaping the arm parts in the FPC 140. Moreover, the arm parts of the FPC 140 facilitates the temporary positioning of the FPC 140, and thus the positioning between the electrodes of the FPC 140 and the terminals on the ceramic board can be performed precisely. As a result, the pitches between the terminals on the ceramic board can be reduced and thus the package 120 and the optical module 200 can be miniaturized.

A light modulation/demodulation chip that can perform both optical modulation and optical demodulation, instead of the optical modulation chips 123 and 201, may be packed in the package 120. In this case, because an interface corresponding to not only the electrical signals that are input to the package 120 but also the electrical signals that are output from the package 120 is provided, the numbers of the electrodes of the FPC 140 and the terminals on the ceramic board further increase. Also in such a case, the work efficiency of soldering between the electrodes of the FPC 140 and the terminals on the ceramic board can be improved by shaping the arm parts in the FPC 140.

[b] Second Embodiment

Features of a second embodiment are that through-holes are provided in the arm parts of the FPC and the FPC is temporarily fixed by inserting leads, which are on the lateral side of the package, into the through-holes.

Figure 6:
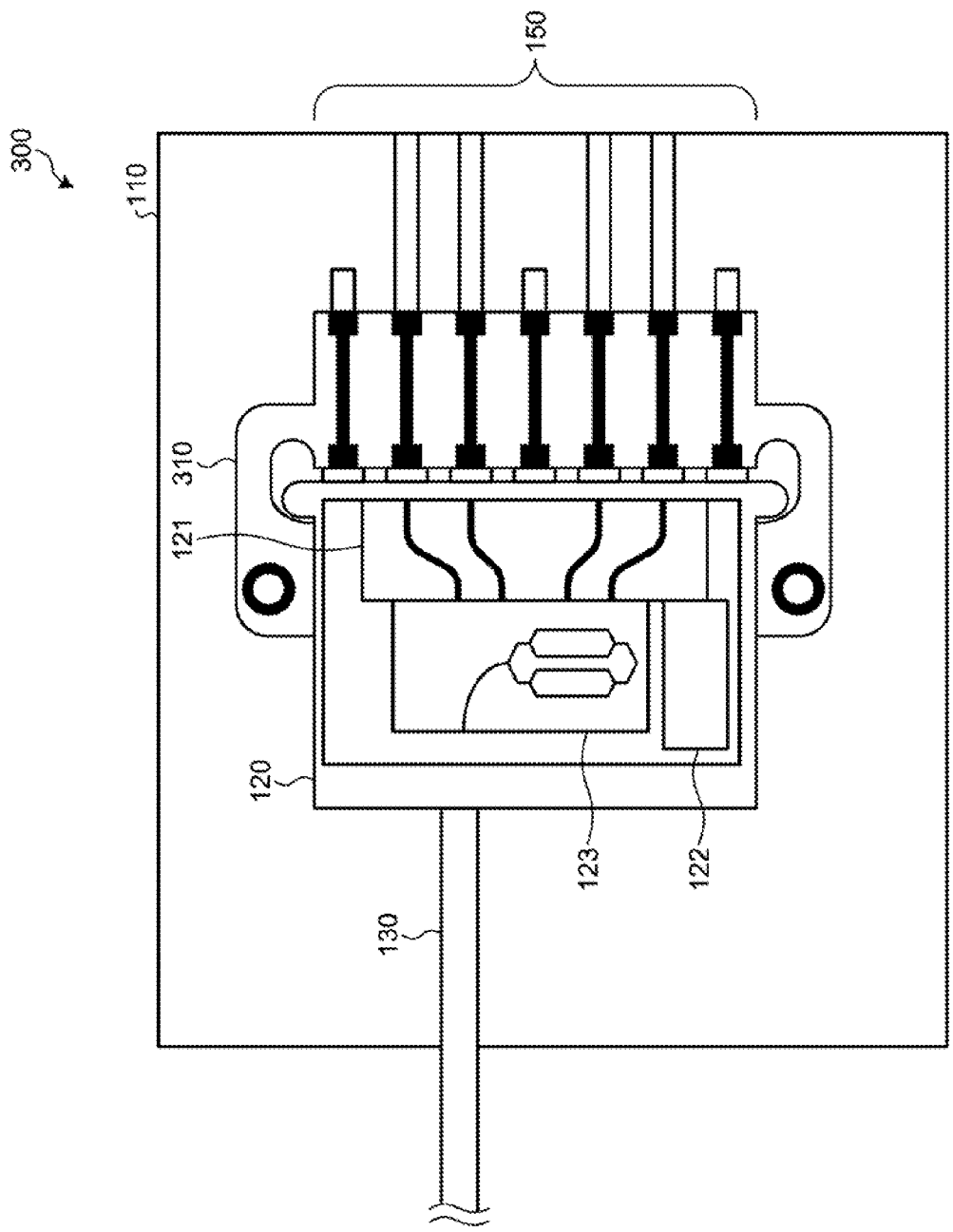
FIG. 6 is a schematic plan view illustrating a configuration of an optical module according to a second embodiment.
Figure 7:
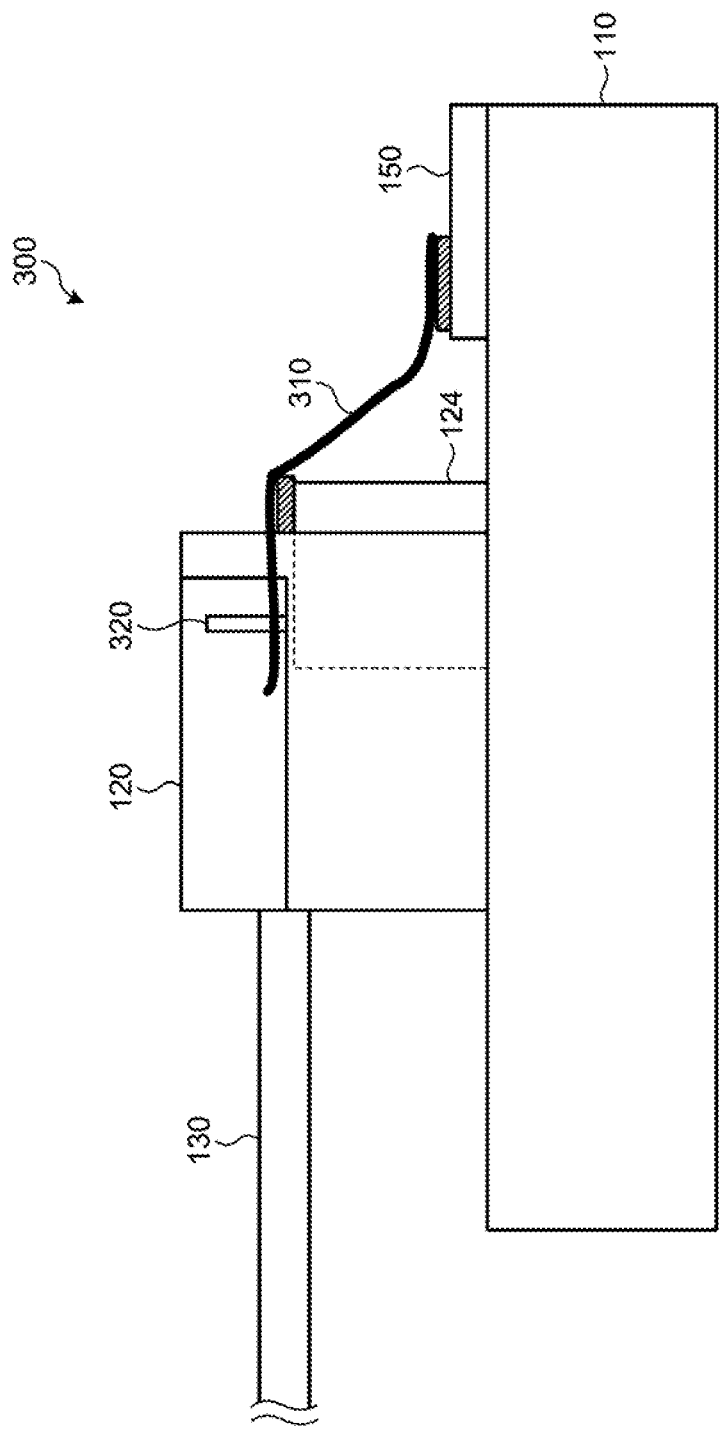
FIG. 7 is a schematic side view illustrating the configuration of the optical module according to the second embodiment.

FIG. 6 is a schematic plan view illustrating a configuration of an optical module 300 according to the second embodiment. FIG. 7 is a schematic side view illustrating the configuration of the optical module 300 according to the second embodiment. In the following description with respect to FIGS. 6 and 7, elements identical with those having been already explained in FIGS. 1 and 2 are denoted by identical reference symbols, and duplicate description will be omitted. The optical module 300 illustrated in FIGS. 6 and 7 includes a FPC 310 instead of the FPC 140 of the optical module 100 illustrated in FIGS. 1 and 2. As illustrated in FIG. 7, leads 320 are shaped at the package 120 of the optical module 300.

The FPC 310 is a flexible board having flexibility, and supplies to the package 120 the electrical signals that are output from the driver (not illustrated). In other words, the FPC 310 includes a plurality of signal electrodes and a plurality of ground electrodes, and transmits the electrical signals to the package 120 by the signal electrodes. Herein, because the differential signals of the I and Q channels are transmitted to the package 120, the FPC 310 includes three ground electrodes at both ends and the center in its width direction, and also includes four signal electrodes. Among the four signal electrodes, two electrodes are located between the one-end and center ground electrodes, and other two electrodes are located between the other-end and center ground electrodes. The signal electrodes and the ground electrodes are respectively soldered to the electrodes 150 at one end, and are respectively soldered to the terminals of the ceramic board 124 of the package 120 at the other end.

Also, the FPC 310 includes arm parts that project to the outer sides in the width direction of the FPC 310 from an electrode arrangement part in which the aforementioned signal electrodes and ground electrodes are arranged and extend toward the package 120. In other words, the arm parts project more outward than the ground electrodes that are located on both ends of the FPC 310 in its width direction, and extend closer to the package 120 than a position in which each of the electrodes is soldered to the terminal of the ceramic board 124. The through-holes are formed in the leading ends of the arm parts of the FPC 310. Both side surfaces of the package 120 are put between the arm parts of the FPC 310 and the leads 320 projected from the package 120 are inserted in the through-holes. Therefore, the FPC 310 is temporarily positioned and temporarily fixed relative to the package 120 to improve the work efficiency of soldering.

Figure 8:
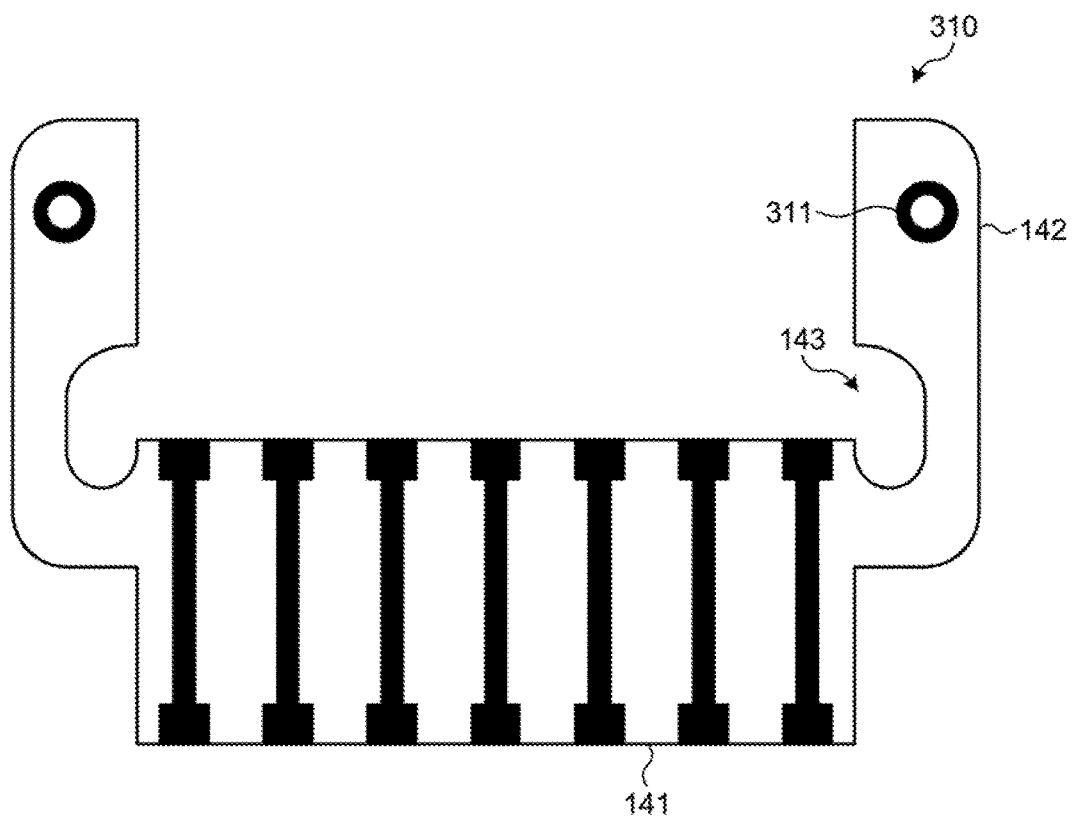
FIG. 8 is a diagram illustrating a configuration of a FPC board according to the second embodiment.

FIG. 8 is a diagram illustrating a configuration of the FPC 310 according to the second embodiment. In the following description with respect to FIG. 8, elements identical with those having been already explained in FIG. 3 are denoted by identical reference symbols, and duplicate description will be omitted.

As illustrated in FIG. 8, the FPC 310 includes the electrode arrangement part 141 and the arm parts 142 and through-holes 311 are formed in the leading ends of the arm parts 142. The through-holes 311 are shaped so that inside walls of penetrate-holes that penetrate the arm parts 142 are covered with conductor patterns. Lands on which the conductor patterns are printed are shaped around the through-holes 311. In this way, the conductor patterns are added to the through-holes 311 and the land, and thus the weight of the arm parts 142 increases, so that the center of gravity of the FPC 310 approaches the package 120. As a result, the state can be easily kept, in which the end part of the electrode arrangement part 141 is in contact with the upper surface of exposed part of the ceramic board 124, and thus the work efficiency of soldering can be improved.

Figure 9:
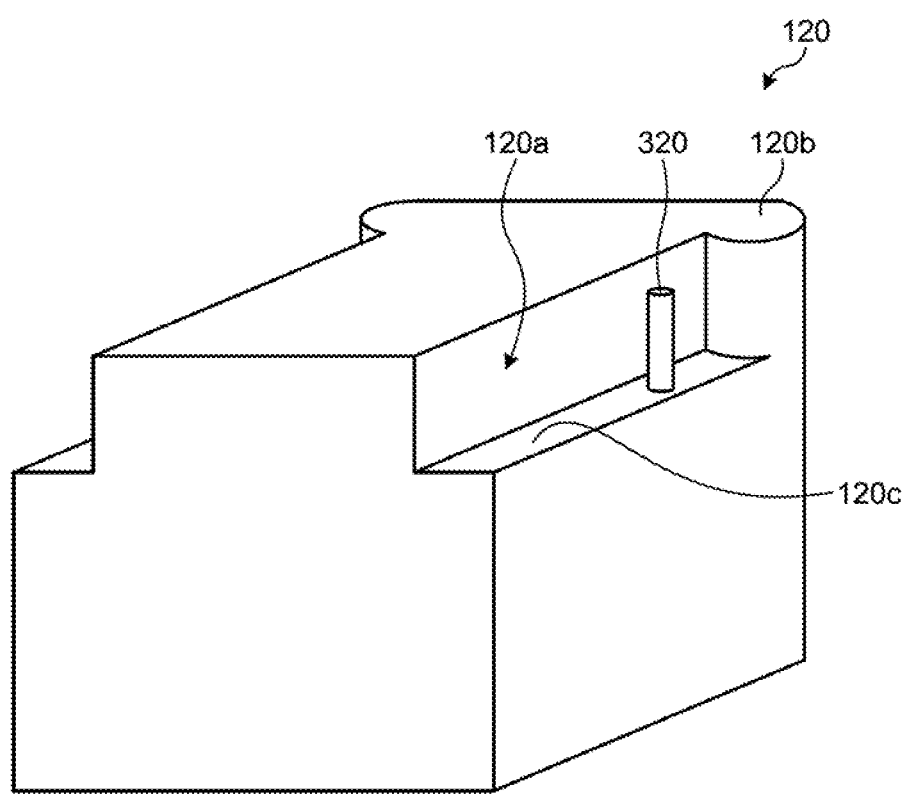
FIG. 9 is a perspective view illustrating a shape of a package according to the second embodiment.

The through-holes 311 can be locked to the leads that are formed on lateral sides of the package 120 to temporarily fix and temporarily position the FPC 310. The shape of the package 120 will be here explained with reference to FIG. 9. FIG. 9 is a perspective view illustrating the shape of the package 120 according to the second embodiment. In the following description with respect to FIG. 9, elements identical with those having been already explained in FIG. 4 are denoted by identical reference symbols.

As illustrated in FIG. 9, the package 120 includes the cutout parts 120a and the projecting parts 120b up both side surfaces of the package 120, and further includes the leads 320 that project from bottom faces 120c of the cutout parts 120a. The leads 320 of the package 120 are inserted into the through-holes 311 of the FPC 310 when the electrodes of the electrode arrangement part 141 and the terminals of the ceramic board 124 are soldered together. The concave parts 143 of the FPC 310 are locked to the projecting parts 120b of the package 120. Therefore, the state can be further easily kept, in which the end part of the electrode arrangement part 141 is in contact with the upper surface of the exposed part of the ceramic board 124, and the temporary positioning relative to the FPC 310 can be done. As a result, the work efficiency of soldering between each of the electrodes that are arranged on the electrode arrangement part 141 and the terminal of the ceramic board 124 can be improved.

As described above, according to the present embodiment, the arm parts are provided, which are projecting to the outer sides of the width direction of the electrode arrangement part of the FPC and also extending toward the package and the through-holes are shaped in the arm parts. Therefore, the leads projecting on the lateral sides of the package are locked into the through-holes of the FPC, and thus the temporary positioning and the temporarily fixing of the FPC are realized. For this reason, the state can be easily kept, in which the end part of the electrode arrangement part of the FPC is in contact with the upper surface of the ceramic board that exposes to the outside from the package, and thus the work efficiency of soldering between the terminals on the upper surface of the ceramic board and the terminals of the FPC can be improved.

In the aforementioned second embodiment, the leads 320 are inserted into the through-holes 311 and also the leads 320 and the through-holes 311 may be fixed by soldering. Thus, positional relationship between the package 120 and the FPC 310 can be surely fixed.

Moreover, the FPC 310 may be fixed without shaping the leads 320 on the package 120. In other words, for example, as illustrated in FIG. 10, a jig 350 is attached to the package 120 and the arm parts 142 of the FPC 310 may be fixed by the jig 350 in an operation of soldering the electrodes of the FPC 310 and the terminals of the ceramic board 124 together. By using the jig 350 in such a manner, shaping the leads 320 on the package 120 is unnecessary and forming the package 120 can be facilitated.

[c] Third Embodiment

Features of a third embodiment are that the arm parts of the FPC are temporarily fixed to a front surface of the package.

Figure 11A:
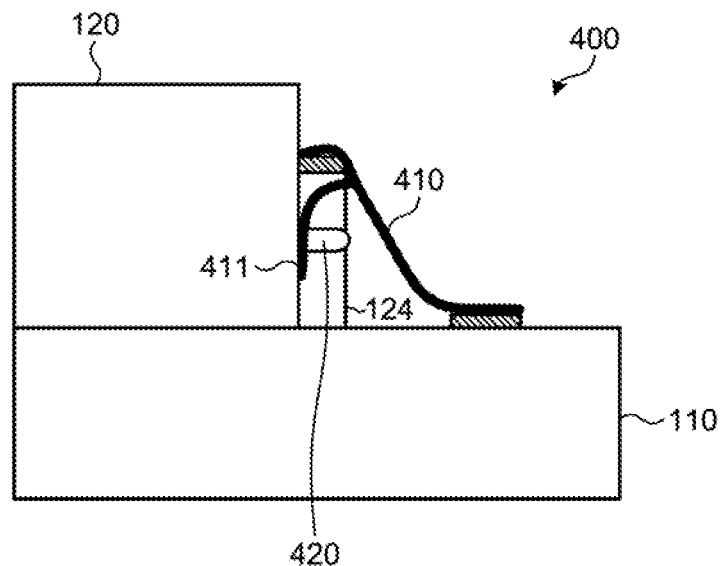
FIG. 11A is a schematic side view illustrating a configuration of an optical module according to a third embodiment.
Figure 11B:
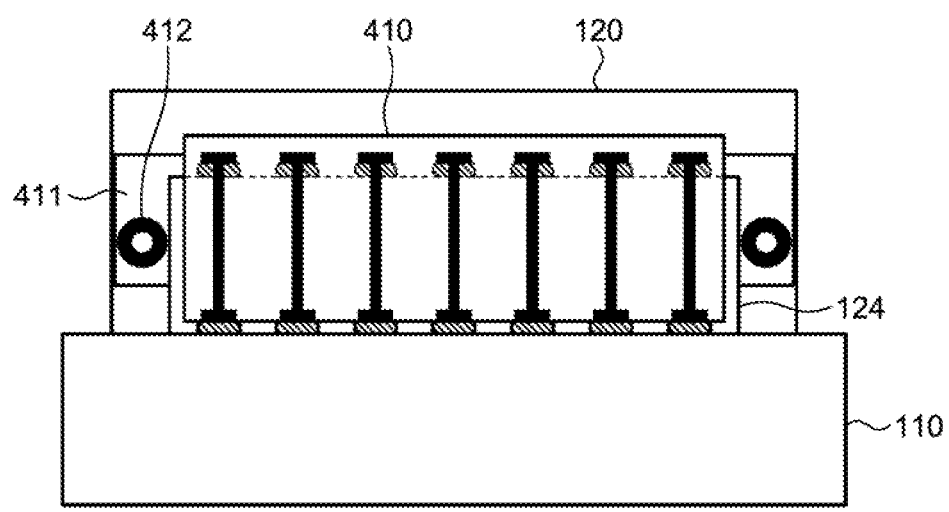
FIG. 11B is a schematic front view illustrating the configuration of the optical module according to the third embodiment.

FIGS. 11A and 11B are schematic views illustrating a configuration of an optical module 400 according to the third embodiment. In the following description with respect to FIGS. 11A and 11B, elements identical with those having been already explained in FIGS. 1 and 2 are denoted by identical reference symbols, and duplicate description will be omitted. FIG. 11A is a schematic side view illustrating the optical module 400 according to the third embodiment. FIG. 11B is a schematic front view illustrating the optical module 400 according to the third embodiment. The optical module 400 illustrated in FIGS. 11A and 11B includes a FPC 410 instead of the FPC 140 of the optical module 100 illustrated in FIGS. 1 and 2. As illustrated in FIG. 11A, leads 420 are shaped on the package 120 of the optical module 400.

The FPC 410 is a flexible board having flexibility, and supplies to the package 120 the electrical signals that are output from the driver (not illustrated). In other words, the FPC 140 includes a plurality of signal electrodes and a plurality of ground electrodes and transmits the electrical signals to the package 120 by the signal electrodes.

The FPC 410 includes arm parts 411 that project to the outer sides in the width direction of the FPC 140 from an electrode arrangement part in which the aforementioned signal electrodes and ground electrodes are arranged, and extend toward the package 120. In other words, the arm parts 411 project more outward than the ground electrodes that are located on both ends of the FPC 410 in the width direction, and extend toward the package 120. The arm parts 411 are bent downward and are locked to the leads 420 that project from the front surface of the package 120. In other words, through-holes 412 are provided in the leading ends of the arm parts 411, and the leads 420 that project from the front surface of the package 120 at the both sides of the ceramic board 124 are inserted into the through-holes 412. Thus, the FPC 410 is temporarily positioned and temporarily fixed relative to the package 120 and work efficiency of soldering is improved.

In this way, in the present embodiment, the arm parts 411 of the FPC 410 are bent downward and are locked to the leads 420 that project from the front surface of the package 120, and thus the side surfaces of the package 120 are not put between the arm parts 411 of the FPC 410. Therefore, the arm parts 411 of the FPC 410 do not protrude from the lateral sides of the package 120, and thus an occupied space by the FPC 410 can be reduced.

As described above, according to the present embodiment, the arm parts are provided, which project to the outer sides of the width direction of the electrode arrangement part of the FPC and also extend toward the package, and are bent downward to be locked to the front surface of the package. Therefore, the temporary positioning and the temporarily fixing of the FPC are done, and thus the state can be easily kept, in which the end part of the electrode arrangement part of the FPC is in contact with the upper surface of the ceramic board that exposes to the outside from the package, and thus the work efficiency of soldering between the terminals on the upper surface of the ceramic board and the terminals of the FPC can be improved. Moreover, because the arm parts of the FPC do not protrude from the sides of the package, the occupied space by the FPC can be reduced.

In the aforementioned third embodiment, the arm parts 411 of the FPC 410 are explained to be bent downward to be locked to the front surface of the package 120, however, the arm parts 411 may be bent upward to be locked to the front surface or an upper surface of the package 120.

In each of the aforementioned embodiments, the package 120 has been explained to be the optical modulation package that includes the optical modulation chip and converts the electrical signals into the optical signals to output the optical signals to the optical fiber 130. However, the FPC having been explained in each of the embodiments may be connected to an optical receiver package that receives the optical signals. In other words, the optical receiver package may receive the optical signals transmitted through the optical fiber 130, and perform optical demodulation of the received optical signals to obtain the electrical signals. Subsequently, the optical receiver package outputs the electrical signals to the signal electrodes of the FPC from the terminals of the ceramic board exposed to the outside. In this case, the signal electrodes of the FPC transmit the electrical signals that are output from the optical receiver package.

In such a case that the optical transmission device includes such an optical receiver package, the efficiency of soldering between the ceramic board and the FPC can be improved and also work efficiency in manufacturing the device can be improved by using the FPC according to each of the aforementioned embodiments. The package 120 may have functions of both the optical modulation package and the optical receiver package.

Figure 12:
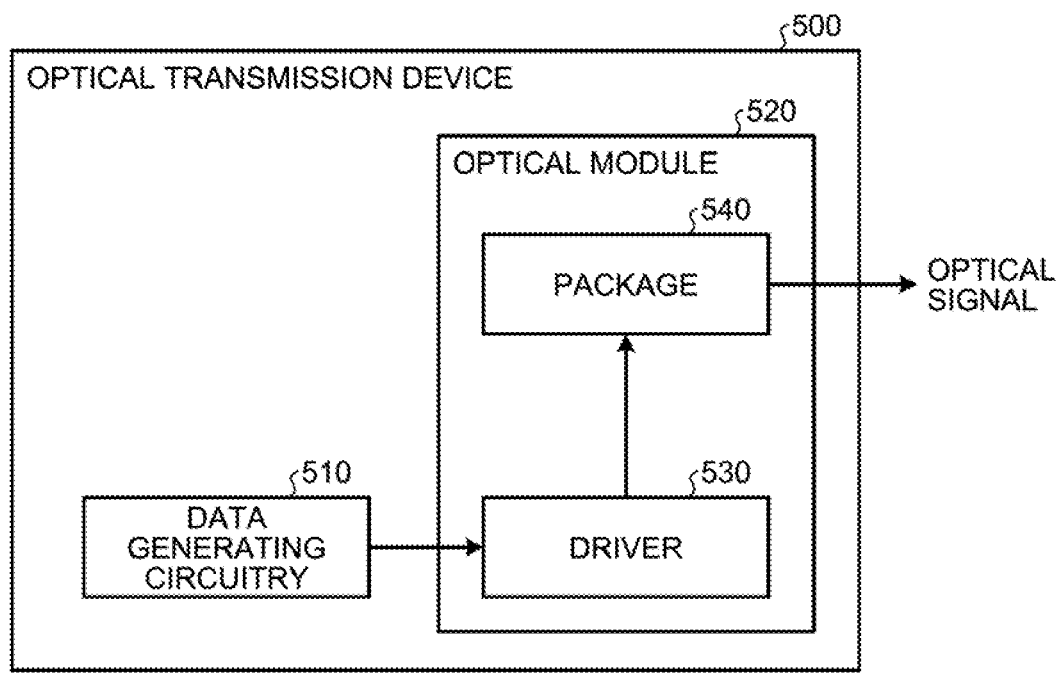
FIG. 12 is a block diagram illustrating a configuration example of an optical transmission device.

The optical module according to each of the aforementioned embodiments can be applied to, for example, an optical transmission device that sends and receives optical signals. FIG. 12 is a block diagram illustrating a configuration example of such an optical transmission device 500.

As illustrated in FIG. 12, the optical transmission device 500 includes data generating circuitry 510 and an optical module 520. The optical module 520 includes a driver 530 and a package 540.

The data generating circuitry 510 generates transmission data to output the transmission data to the optical module 520. The transmission data that are output to the optical module 520 are input to the driver 530 in the optical module 520 and the electrical signals corresponding to the transmission data are generated by the driver 530. The electrical signals are supplied to the package 540 from the driver 530 and the optical modulation is performed on the basis of the electrical signals.

The FPC 140, 310, or 410 having been explained in each of the aforementioned embodiments is used for connection between the driver 530 and the package 540. Thus, work efficiency of soldering between an electrical interface of the package 540 and the FPC 140, 310, or 410 can be improved and pitches between terminals that are used as the electrical interface can be reduced. As a result, the package 540 and the optical module 520 can be miniaturized and thus miniaturization of the optical transmission device 500 can be conducted.

There are various kinds of optical modulation methods of the package 540. For example, the Quadrature Amplitude Modulation (QAM) method may be adopted other than the Differential Quadrature Phase Shift Keying (DQPSK) method or the Dual Polarization Quadrature Phase Shift Keying (DPQPSK) method according to each of the aforementioned embodiments. When adopting a technique such as the QAM method or a high density wavelength multiplexing by Nyquist filtering, it is desirable that quality of impedance matching in the optical module 520 is high. On this point, in each of the aforementioned embodiments, even if the terminals to be soldered are getting shorter by miniaturizing the part of the ceramic board 124 that exposes to the outside, efficient soldering work can be performed and also accuracy of the impedance matching can be improved.

According to an aspect of an optical transmission device and an optical module disclosed in the present application, work efficiency in manufacturing devices can be improved.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical transmission device comprising:
an optical modulation package that includes a plurality of terminals that are exposed to an outside from a front surface thereof and projecting portions that bulge out laterally from a side surfaces thereof, and performs optical modulation on electrical signals input from the terminals;
a flexible board that includes:
an electrode arrangement part on which electrodes respectively connected to the terminals are arranged side by side to transmit the electrical signals to the terminals; and
a pair of arm parts that project more outward than an electrode located on an end of the electrode arrangement part and extend along the side surfaces of the optical modulation package to sandwich the optical modulation package, each of the arm parts including a concave part to be hooked to one of the projecting portions of the optical modulation package; and
an optical transmission member that transmits an optical signal obtained by the optical modulation performed by the optical modulation package.

2. The optical transmission device according to claim 1, wherein each of the arm parts further includes a through-hole that penetrates the arm part from one surface to another surface thereof.

3. The optical transmission device according to claim 2, wherein
the optical modulation package includes a lead that projects on a lateral side thereof, and
at least one of the arm parts is connected to the optical modulation package by inserting the lead into the through-hole.

4. The optical transmission device according to claim 3, wherein at least one of the arm parts is soldered to the lead at the through-hole.

5. The optical transmission device according to claim 1, wherein
the optical modulation package includes:
an optical modulator that performs optical modulation on the electrical signals corresponding to a plurality of channels;
a plurality of first terminals that are exposed to the outside, and have ground voltage; and
a plurality of second terminals that are exposed to the outside between the first terminals, and corresponds to the electrical signals that are subjected to the optical modulation by the optical modulator.

6. An optical transmission device comprising:
an optical transmission member that transmits an optical signal;
an optical receiver package that includes a plurality of terminals that are exposed to an outside from a front surface thereof and projecting portions that bulge out laterally from a side surfaces thereof, receives the optical signal transmitted through the optical transmission member to convert the optical signal into electrical signals, and outputs the electrical signals from the terminals; and
a flexible board that includes:
an electrode arrangement part on which electrodes respectively connected to the terminals are arranged side by side to transmit the electrical signals from the terminals; and
a pair of arm parts that project more outward than an electrode located on an end of the electrode arrangement part and extend along the side surfaces of the optical receiver package to sandwich the optical receiver package, each of the arm parts including a concave part to be hooked to one of the projecting portions of the optical receiver package.

7. An optical module comprising:
an optical modulation package that includes a plurality of terminals that are exposed to an outside from a front surface thereof and projecting portions that bulge out laterally from side surfaces thereof, and performs optical modulation on electrical signals input from the terminals;
a flexible board that includes:
an electrode arrangement part on which electrodes respectively connected to the terminals are arranged side by side to transmit the electrical signals to the terminals; and a pair of arm parts that project more outward than an electrode located on an end of the electrode arrangement part and extend along side surfaces of the optical modulation package to sandwich the optical modulation package, each of the arm parts including a concave part to be hooked to one of the projecting portions of the optical modulation package.

\* \* \* \* \*